United States Patent
He et al.

(10) Patent No.: US 6,177,316 B1
(45) Date of Patent: Jan. 23, 2001

(54) POST BARRIER METAL CONTACT IMPLANTATION TO MINIMIZE OUT DIFFUSION FOR NAND DEVICE

(75) Inventors: Yue-Song He, San Jose; Kent K. Chang, Cupertino; John J. Wang, San Jose, all of CA (US)

(73) Assignee: Advanced Micro Devices, Inc., Sunnyvale, CA (US)

( * ) Notice: Under 35 U.S.C. 154(b), the term of this patent shall be extended for 0 days.

(21) Appl. No.: 09/412,278

(22) Filed: Oct. 5, 1999

(51) Int. Cl.[7] .................................................. H01L 21/336
(52) U.S. Cl. ............................................................ 438/258
(58) Field of Search .................................. 438/258, 142, 438/197, 257

(56) References Cited

U.S. PATENT DOCUMENTS

| | | | |
|---|---|---|---|
| 4,811,078 | * | 3/1989 | Tigelaar et al. .................... 257/311 |
| 5,229,311 | * | 7/1993 | Lai et al. ............................ 438/143 |
| 5,427,963 | * | 6/1995 | Richart et al. ..................... 438/257 |
| 5,429,975 | * | 7/1995 | Sheu et al. ......................... 438/276 |
| 5,488,009 | * | 1/1996 | Hsue et al. ......................... 438/278 |
| 5,516,713 | | 5/1996 | Hsue et al. ........................... 437/43 |
| 5,581,504 | | 12/1996 | Chang ............................. 365/185.17 |
| 5,760,475 | * | 6/1998 | Cronin et al. ...................... 257/758 |
| 5,830,789 | * | 11/1998 | Lien et al. ......................... 438/217 |
| 5,846,863 | | 12/1998 | Lee et al. .......................... 438/275 |
| 5,972,179 | * | 10/1999 | Chittipeddi et al. ............. 204/192.17 |

* cited by examiner

*Primary Examiner*—Vu A. Le
*Assistant Examiner*—Christian D. Wilson
(74) *Attorney, Agent, or Firm*—Skjerven Morrill MacPherson LLP; Theodore P. Lopez

(57) ABSTRACT

An improved method for fabricating a NAND-type memory cell structure. The present invention forgoes providing a contact mask implantation process prior to deposition of a metal barrier layer, which is a typical order of processing the NAND-type memory cell. Instead, in the present invention, the metal barrier layer is deposited on a core area of the NAND-type memory cell prior to contact mask implantation. Thereafter, the contact mask implantation process is performed on the structure in a conventional manner.

18 Claims, 5 Drawing Sheets

POST BARRIER METAL CONTACT IMPLANTATION TO MINIMIZE OUT DIFFUSION FOR NAND DEVICE

FIELD OF THE INVENTION

The present invention relates to electrically erasable and programmable read-only memory (EEPROM) technology. More particularly, to an improved method of fabricating NAND devices having floating gates.

BACKGROUND OF THE INVENTION

A conventional core cell in a NAND array memory device is described with reference to FIGS. 1A and 1B, which are simplified cross sectional diagrams of the conventional NAND array 10 having a floating gate memory cell 12. The memory cell 12 is a floating gate transistor having a control gate 14 separated from a polycrystalline silicon floating gate 16 by an upper insulating layer while floating gate 16 is separated from a substrate 18 by a lower insulating layer. The substrate includes n+ source regions 20, a p-doped body region 22, and an n+ drain region 24 as in a conventional NMOS enhancement mode transistor.

As illustrated in FIG. 1A, in order to program the conventional floating gate memory cell 10, control gate 14 is biased at a relatively high voltage of approximately 20 volts while body region 22 is rounded. The high voltage on the control gate 14 induces electrons from body region 22 to tunnel through the lower insulation layer and into floating gate 16 through a conventionally known process called Fowler-Nordheim tunneling. The floating gate 16 accumulates negative charge thereby increasing the threshold voltage of memory cell 12. As illustrated in FIG. 1B, erasing occurs by biasing the body region 22 at a high voltage of approximately 20 volts while the control gate 14 is grounded causing the electrons from floating gate 16 to tunnel through the lower insulation layer and into the body region 22. A NAND EEPROM based non-volatile flash memory architecture is described in U.S. Pat. No. 5,568,420, filed Nov. 30, 1994, which is herein incorporated by reference for all purposes.

Generally, a conventional NAND memory cell device, as described above, is a high density device subject to high voltage requirements. Although, the high density, high voltage characteristics are desirable traits in a NAND cell structure, these traits tend to make bit line to bit line isolation within the NAND structure more difficult. Specifically, since there is usually not enough margin for isolation between bit lines in the NAND array structure, the outdiffusion of impurities may result in low junction breakdown and bit line to bit line leakage.

Therefore, what is desired is an improved method for fabricating the NAND array structure which improves the reliability of the NAND memory cell structure by minimizing outdiffusion.

SUMMARY OF THE INVENTION

The present invention provides an improved method for fabricating a NAND-type memory cell structure. To improve the conventional NAND-type memory cell fabrication process, described in detail below, the present invention forgoes providing the contact mask implantation process prior to deposition of the metal barrier layer, which is a typical order of processing the NAND-type memory cell. Instead, in the present invention, the metal barrier layer is deposited on a core area of the NAND-type memory cell prior to contact mask implantation. Thereafter, the contact mask implantation process is performed on the structure in a conventional manner.

Accordingly, the dopant from the contact mask process concentrates itself at the Ti/Si interface, thus, minimizing the outdiffusion of impurities which is typical of NAND array structures fabricated using the conventional method of implanting directly into silicon. The improved fabrication process improves the performance and reliability of the NAND array structure by minimizing outdiffusion of impurities. The minimization of outdiffusion reduces the potential for bit line to bit line leakage and low junction breakdown.

In one aspect of the present invention, a method is provided for fabricating a memory structure. The method includes forming a metal barrier layer on a core area of a memory structure; and thereafter, performing a contact implantation process on said memory structure to reduce impurity outdiffusion. The core area includes a portion of NAND-type core memory cell structure.

The present invention being better understood upon consideration of the detailed description below, in conjunction with the accompanying drawings.

DESCRIPTION OF THE INVENTION

Figure 2:
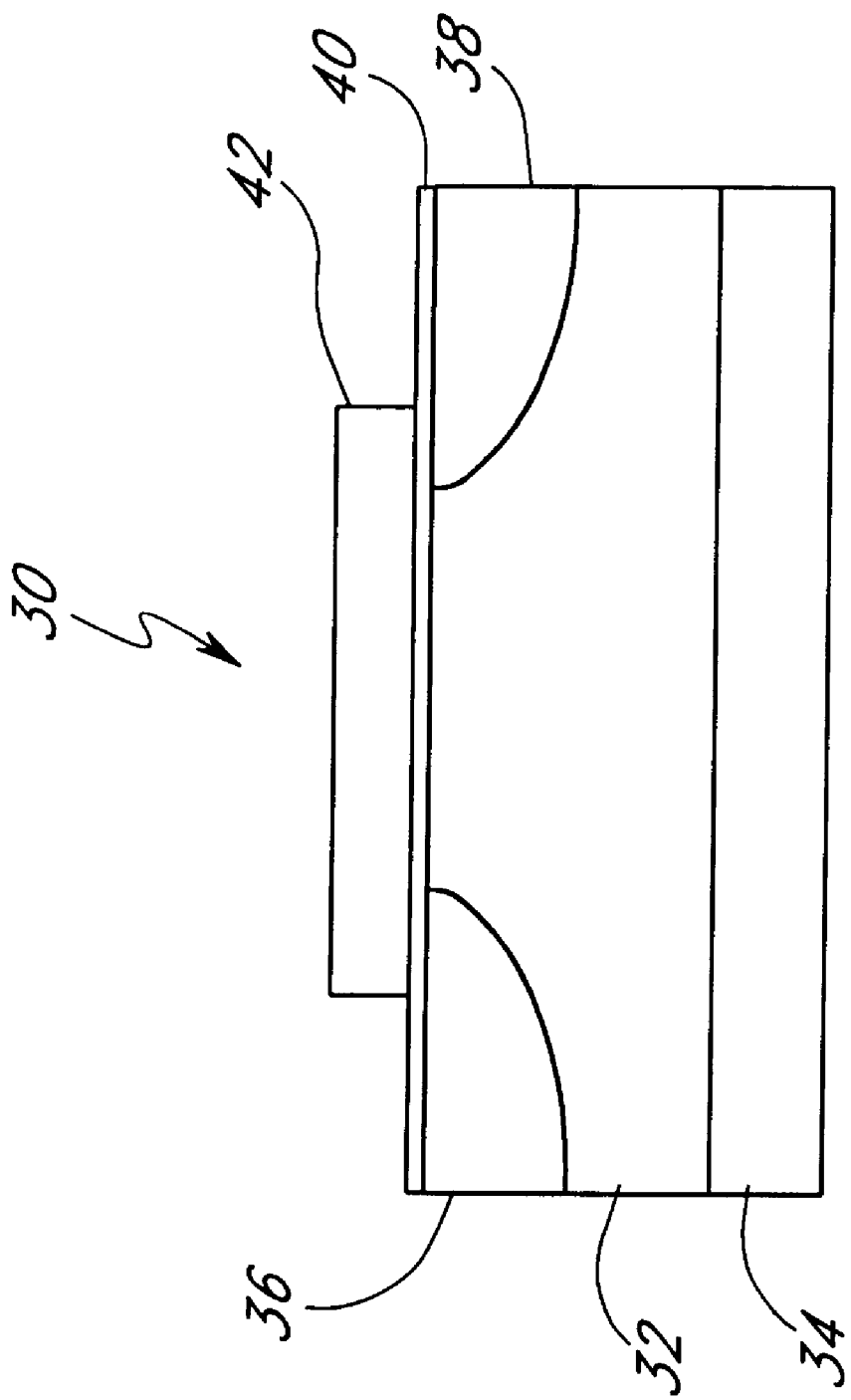
FIG. 2 is a simplified illustration of a cross-sectional view of a portion of the memory cell of FIG. 1A in one stage of fabrication according to principles of the present invention.

In one embodiment of the present invention, shown in FIG. 2, a NAND-type memory core cell 30 is formed of an active region having a deep N-well 34 and a P-well 32. The P-well region 32 has a source region 36 and a drain region 38. In this embodiment a tunnel oxide layer 40 is formed of between about 70 Å and 110 Å, preferably 87 Å in thickness over the active region.

A layer of amorphous silicon 42 is deposited over tunnel oxide layer 40 using a low pressure chemical vapor deposition (LPCVD) process. The LPCVD process involves directing a mixture of silane gas ($SiH_4$) and a phosphine ($PH_3$) and helium gas mixture towards tunnel oxide layer 40 in an environment with a temperature between 450° C. and 590° C., preferably 530° C. The flow rate of the silane gas is between about 1500 sccm and 2500 sccm, preferably 2000 sccm. The flow rate of the phosphine-helium gas mixture is between about 15 sccm and 30 sccm, preferably 22 sccm. In the phosphine and helium gas mixture, phosphine is provided at approximately one percent of the mixture. In this embodiment, the desired doping level in the amorphous silicon is between about $1\times10^{19}$ atoms/cm$^3$ and $3\times10^{20}$ atoms/cm$^3$, preferably $1\times10^{20}$ atoms/cm$^3$.

Next, the resulting structure 30 of FIG. 2 is cleaned to remove contaminants. There are many methods to clean the structure. For example, the structure may be dipped in a 5:1:1 water, hydrogen peroxide, and ammonium hydroxide ($H_2O:H_2O_2:NH_4OH$) solution with a temperature of 60° C. for 5 minutes and then rinsed conventionally. Alternatively, the structure may be dipped in a 6:1:1 water, hydrogen peroxide, and hydrogen chloride ($H_2O:H_2O_2:HCl$) solution with a temperature of 60° C. for 5 minutes.

Alternatively, a layer of amorphous silicon 42 may be deposited over tunnel oxide layer 40 using a low pressure chemical vapor deposition (LPCVD) process. The LPCVD process involves directing a mixture of silane gas ($SiH_4$), a phosphine ($PH_3$) and helium gas mixture, and ammonia ($NH_3$) towards tunnel oxide layer 40 in an environment with a temperature between about 510° C. and 580° C., preferably 530° C. The flow rate of the silane gas is between about 1500 sccm and 2500 sccm, preferably 2000 sccm. The flow rate of the phosphinehelium gas mixture is between about 15 sccm and 30 sccm, preferably 22 sccm. In the phosphine and helium gas mixture, phosphine is provided at approximately one percent of the mixture. In this embodiment, the flow rate of ammonia is adjusted to achieve a desired doping level in the amorphous silicon between $1 \times 10^{19}$ atoms/cm$^3$ and $5 \times 10^{19}$ atoms/cm$^3$, preferably $2 \times 10^{19}$ atoms/cm$^3$.

Figure 1:
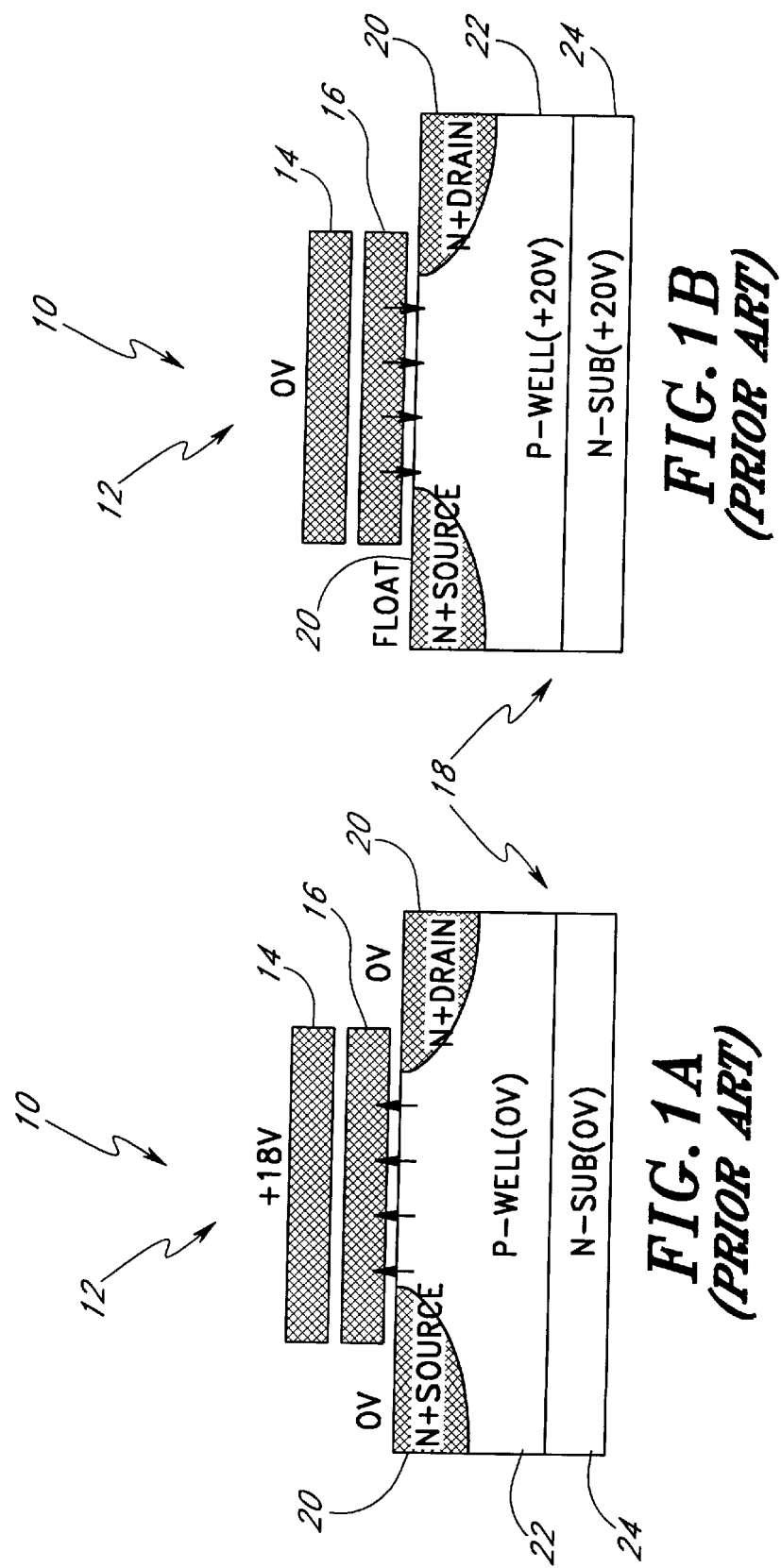
FIGS. 1A and 1B are simplified cross-sectional diagrams of a conventional floating gate memory cell of a NAND array.

In the preferred embodiment, amorphous silicon layer 42 may then be removed except for regions that overlap with source region 36 and drain region 38 by use of a conventional anisotropic dry etch technique. A suitable dry etch technique directs a mixture of $Cl_2$ and HBr gases with flow rates of about 30 sccm and 70 sccm, respectively, at amorphous silicon layer 42 until etching of tunnel oxide layer 40 is detected. Tunnel oxide layer 40 thereby acts as the "stop layer". In this embodiment, the RF power of the etcher is set to 120 watts at a pressure of 125 millitorr. The resulting patterned amorphous silicon layer 42 corresponds to floating gate 16 of FIG. 1A when it is subsequently annealed.

Figure 3:
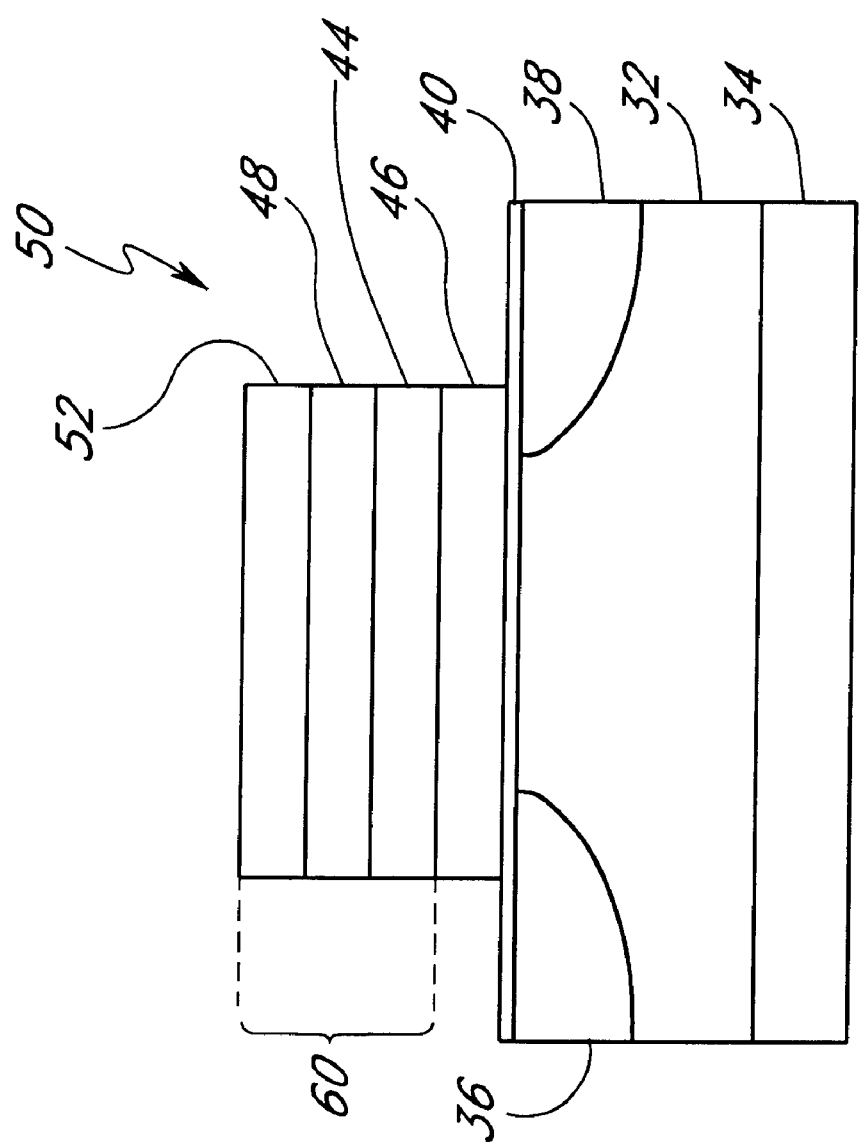
FIG. 3 is a simplified illustration of a cross-sectional view of a portion of the memory cell of FIG. 1A in another stage of fabrication according to principles of the present invention.

Referring to FIG. 3, after forming resulting structure 30, a first oxide layer 44 is deposited over resulting structure 30 using a Low Pressure Chemical Vapor Deposition (LPCVD) process. In the LPCVD process, silane and $N_2O$ gases are directed towards the surface of the semiconductor substrate at flow rates of about 20 sccm and 1200 sccm, respectively. The resulting structure 50 of FIG. 3 is then heated to a temperature of 750° C. in an environment with a pressure of 600 millitorr (hereinafter "first oxide heating step"). In this embodiment, the thickness of first oxide layer 44 is 50 Å.

The first oxide heating step also acts to transform the patterned amorphous silicon into oxidation resistant polysilicon layer 46 of FIG. 3 with a thickness, in this embodiment, of 900 Å. Heating the amorphous silicon in the process of forming the lower oxide layer rather than in the "alternative heating step" eliminates a thermo-cycle and the associated diminution of the polysilicon layer that will later become the floating gate.

Next, a middle nitride layer 48 is deposited using an LPCVD process. First, a mixture of dichlorosilane gas ($SiH_2Cl_2$) and ammonia gas ($NH_3$) are directed towards the structure with flow rates of about 100 sccm and 600 sccm, respectively. The resulting structure is then heated to a temperature of 760° C. In this embodiment, middle nitride layer 48 is formed to a thickness of approximately 80 Å.

An upper oxide layer 52 is then formed on the resulting structure using a wet thermal oxidation process. First, $O_2$ and $H_2$ are directed to the structure at flow rates of 5 L/min and 9 L/min, respectively. The resulting structure is then heated to 950° C. In this embodiment, approximately 20 to 25 Å of middle nitride layer 48 are oxidized to form a 40 to 50 Å thick upper oxide layer 52. In this embodiment, first oxide layer 44, middle nitride layer 48, and upper oxide layer 52 together form an ONO stack 60 as shown in FIG. 3, which is approximately 130 Å.

Figure 4:
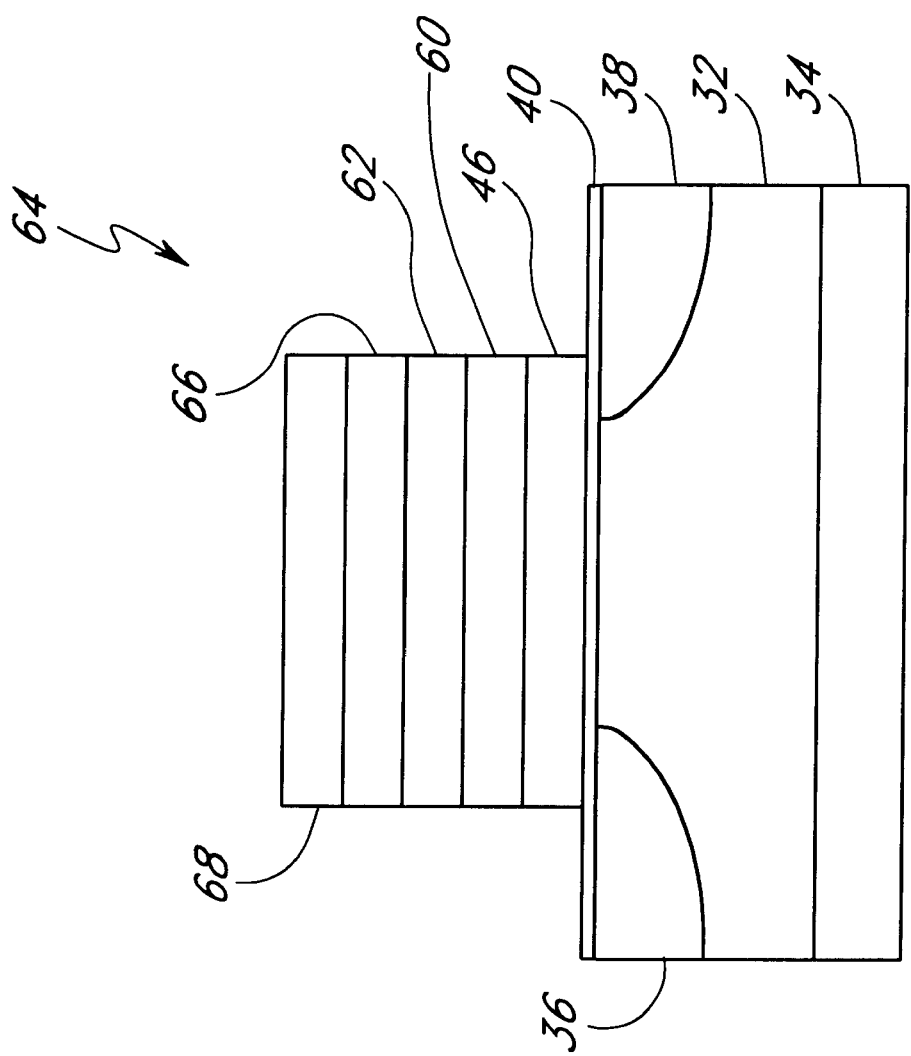
FIG. 4 is a simplified illustration of a cross-sectional view of a portion of the memory cell of FIG. 1A in yet another stage of fabrication according to principles of the present invention.

Referring to FIG. 4, after formation of ONO stack 60, a second layer of amorphous silicon 62 is deposited over ONO stack 60 using an LPCVD process. The LPCVD process involves directing a mixture of silane gas and a phosphine-helium gas-compound towards structure 64 with flow rates of about 2000 sccm and 75 sccm, respectively, in an environment with a temperature of about 530° C. In the phosphine-helium gas-compound, phosphine represents one percent of the mixture. In this embodiment, the desired doping level of the second layer of amorphous silicon 62 is about $2 \times 10^{20}$ atoms/cm$^3$. The second layer of amorphous silicon corresponds to an intermediate form of a second layer of polysilicon (poly II layer) 62. In this embodiment, the thickness of the poly II layer is about 1200 Å.

Next, tungsten silicide ($WSi_x$) layer 66 is deposited conventionally over the device by a mixture of $WF_6$ and silane using an LPCVD process. The value of x varies from 2.1 to 2.6. In this embodiment, the thickness of the tungsten silicide layer 66 is about 1500 Å.

In one embodiment, a silicon oxy-nitride (SiON) layer 68 is deposited conventionally over tungsten silicide ($WSi_x$) II layer 66 using a mixture of silane and $N_2O$ in a CVD process. In this embodiment, the thickness of SiON layer 68 is about 1000 Å. Resulting structure 64 with oxidation resistant polysilicon layer 46, ONO 60, poly II layer 62, tungsten silicide layer 66, and SiON layer 68 is shown in FIG. 4.

The processing steps remaining to complete the core area of the NAND-type memory may include: etching SiON layer 68, tungsten silicide layer 66, poly II layer 62, and ONO 60 from above source region 36 and drain region 38; a medium doped drain (MDD) implant in source region 36 and drain region 38; an MDD anneal; a spacer deposition and etch; a contact mask and etch; and an high temperature oxide (HTO) deposition. The process steps, thus described, are intended to illustrate one embodiment of the fabrication process for a core area of a representative NAND-type memory cell. Modifications, additions, and deletions to the above process may be made while maintaining the scope of the present invention.

Figure 5:
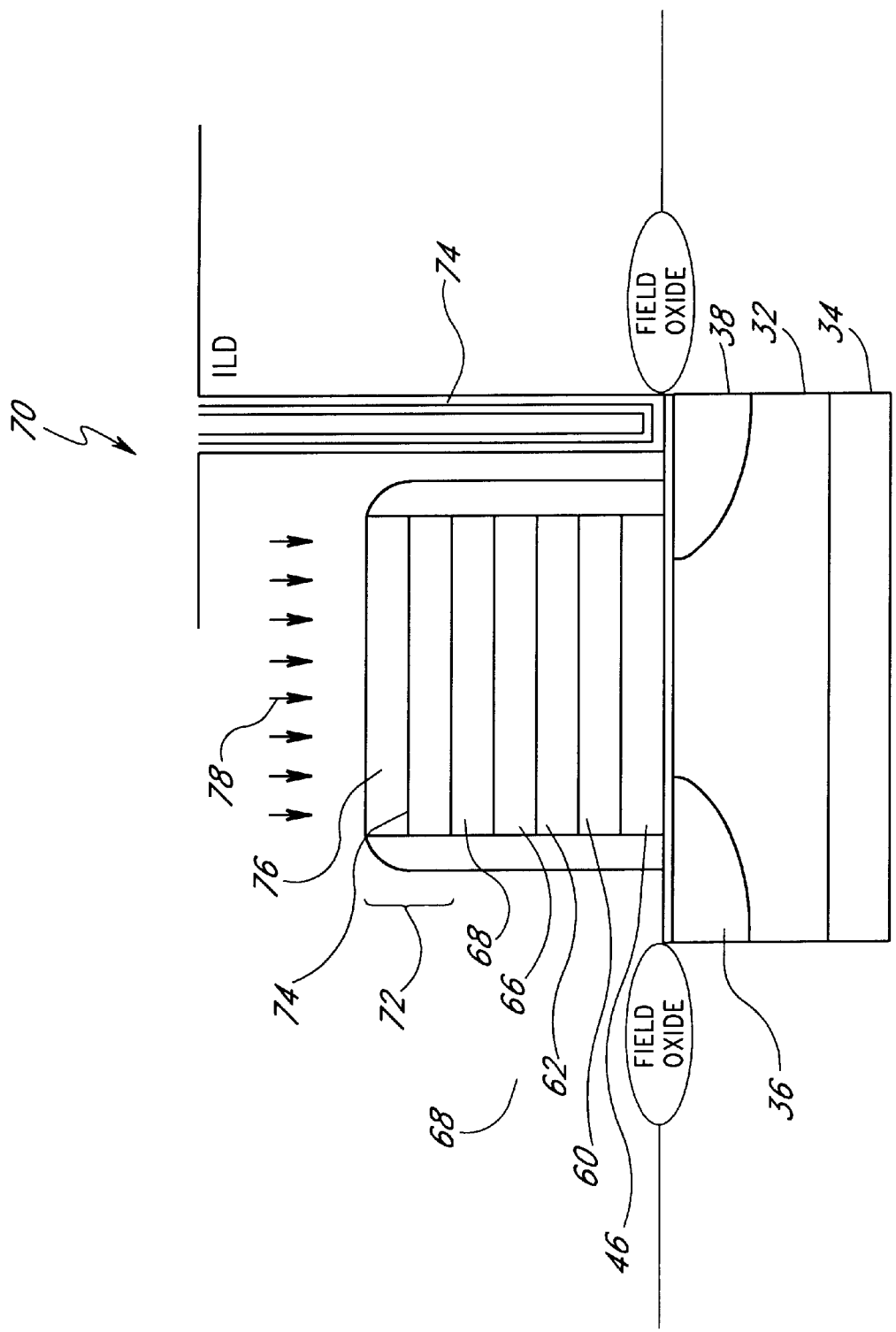
FIG. 5 is a simplified illustration of a cross-sectional view of a NAND-type memory cell using the process of the present invention.

As illustrated in FIG. 5, once core area 70 has been formed, a barrier metal layer 72 is deposited using a CVD process. To form the barrier, colimated Ti 74 is directed towards the structure 70, which serves as a "glue" layer. When applied, colimated Ti 74 prevents oxide interference by bonding with $O_2$ to form $TiO_2$, thus breaking oxide film away from the core area. The bonding energy is provided, in this embodiment, by heating core area 70 to about 250° C. In this embodiment, Ti layer 74 is formed to a thickness of approximately 600 Å. Next, TiN layer 76 is deposited on layer 74 using a mixture of Ti and $N_2$ in a CVD process, with flow rates of about 500 sccm and 300 sccm, respectively. The resulting structure 70 is then heated to a temperature of about 450° C. In this embodiment, TiN layer 76 is formed to a thickness of approximately 150 Å. Metal barrier layer 72 is approximately, 750 Å thick.

After formation of metal barrier layer 72, an implantation process 78 is performed. First, a contact implant mask for N+ implant is made using a photoresist process. In one embodiment the n+ implant may include, but is not limited to, phosphorous ions implanted into metal barrier layer 72.

The ions in layer 72 may result in a concentration of between about $8 \times 10^{14}$ ion/cm$^2$ and $2 \times 10^{15}$ ion/cm2, preferably $1 \times 10^{15}$ ion/cm$^2$. In this embodiment, the implantation energy may be between about 10 keV and 40 keV, preferably 35 keV. The ions are implanted to a depth of between about 250 and 1000 Å below the surface of layer 72 with a tilt of zero degrees and a twist of 35 degrees. Second, a contact implant mask for P+ implant is made using a photoresist process. In one embodiment the P+ implant may include, but is not limited to, BF$_2$ implanted into metal barrier layer 72. The BF$_2$ in layer 72 may result in a concentration of between about $2 \times 10^{14}$ ion/cm$^2$ and $8 \times 10^{14}$ ion/cm$^2$, preferably $5 \times 10^{14}$ ion/cm$^2$. In this embodiment, the implantation energy may be between about 30 keV and 60 keV, preferably 50 keV. The ions are implanted to a depth of between about 1000 and 1800 Å below the surface of layer 72 with a tilt of 7 degrees and a twist of 35 degrees. Implantation process 78 is completed with a contact rapid thermal anneal at about 950° C. in N$_2$ for about 20 seconds.

The remaining steps proceed in the conventional manner, and may include a Tungsten metal deposition, Tungsten polish and post Tungsten scrub, and a Ti/TiN/AlCu/TiN metal deposition.

Although the present invention has been described with reference to specific embodiments, these embodiments are illustrative only and not limiting. Many other applications and embodiments of the present invention will be apparent in light of this disclosure and the following claims.

What is claimed is:

1. A method for fabricating a memory structure comprising:

forming a metal barrier layer on a core area of a memory structure; and thereafter, performing a contact implantation process on said memory structure to reduce impurity outdiffusion, said contact implantation process including depositing an N+ implant resist strip, said N+ implant including phosphorous ions implanted into said metal barrier layer, said ions in a concentration of between about $8 \times 10^{14}$ ion/cm$^2$ and $2 \times 10^{15}$ ion/cm$^2$, and implanted to a depth of between about 250 and 1000 Å below the surface of the metal barrier layer with a tilt of 0 degrees and a twist of 35 degrees.

2. The method of claim 1 wherein the implantation energy is between about 10 keV and 40 keV.

3. A method for fabricating a memory structure comprising:

forming a metal barrier layer on a core area of a memory structure; and thereafter, performing a contact implantation process on said memory structure to reduce impurity outdiffusion, said contact implantation process including depositing an P+ implant resist strip, said P+ implant including BF$_2$ implanted into said metal barrier layer, said ions in a concentration of between about $2 \times 10^{14}$ ion/cm$^2$ and $8 \times 10^{14}$ ion/cm$^2$, said ions implanted to a depth of between about 1000 and 1800 Å below the surface of the metal barrier layer with a tilt of 7 degrees and a twist of 35 degrees.

4. The method of claim 3 wherein the implantation energy is between about 30 keV and 60 keV.

5. The method of claim 3 wherein said core area comprises a portion of NAND-type core memory cell structure.

6. The method of claim 3 wherein said core area comprises a semiconductor substrate having channel regions isolated from field oxide regions, a first oxide layer, an oxidation resistant polysilicon layer, and a second oxide layer.

7. The method of claim 3 wherein said forming comprises depositing colimated Ti on said core area which prevents oxidation.

8. The method of claim 7 wherein said forming comprises heating said core area to about 250° C.

9. The method of claim 7 wherein said Ti is deposited to a thickness of about 600 Å.

10. A method for fabricating a memory structure comprising:

forming a metal barrier layer on a core area of a memory structure; and thereafter, performing a contact implantation process on said memory structure to reduce impurity outdiffusion, said forming including depositing colimated Ti on said core area which prevents oxidation and including depositing a mixture of Ti and N$_2$ directed at the layer of colimated Ti with flow rates of about 500 sccm and 300 sccm, respectively, to form a TiN layer.

11. The method of claim 10 wherein said deposited TiN layer is heated to a temperature of about 450° C.

12. The method of claim 11 wherein said TiN layer is formed to a thickness of approximately 150 Å.

13. The method of claim 1 wherein said core area comprises a portion of NAND-type core memory cell structure.

14. The method of claim 1 wherein said core area comprises a semiconductor substrate having channel regions isolated from field oxide regions, a first oxide layer, an oxidation resistant polysilicon layer, and a second oxide layer.

15. The method of claim 1 wherein said forming comprises depositing colimated Ti on said core area which prevents oxidation.

16. The method of claim 15 wherein said forming comprises heating said core area to about 250° C.

17. The method of claim 15 wherein said Ti is deposited to a thickness of about 600 Å.

18. A method for fabricating a memory structure comprising:

forming a metal barrier layer on a core area of a memory structure;

thereafter, performing a contact implantation process on said memory structure to reduce impurity outdiffusion; and annealing said memory structure using a contact rapid thermal anneal at about 950° C. in N$_2$ for about 20 seconds.

* * * * *